(12) United States Patent
Lerner et al.

(10) Patent No.: US 11,037,812 B2
(45) Date of Patent: Jun. 15, 2021

(54) METHOD FOR A TRANSFER PRINT BETWEEN SUBSTRATES

(71) Applicant: X-FAB SEMICONDUCTOR FOUNDRIES GMBH, Erfurt (DE)

(72) Inventors: Ralf Lerner, Erfurt (DE); Oliver Haluch, Bonn (DE)

(73) Assignee: X-FAB SEMICONDUCTOR FOUNDRIES GMBH, Erfurt (DE)

(*) Notice: Subject to any disclaimer, the term of this patent is extended or adjusted under 35 U.S.C. 154(b) by 0 days.

(21) Appl. No.: 15/601,222

(22) Filed: May 22, 2017

(65) Prior Publication Data
US 2018/0040501 A1 Feb. 8, 2018

(30) Foreign Application Priority Data
May 23, 2016 (DE) .................. 102016109459.5

(51) Int. Cl.
*H01L 21/68* (2006.01)
*H01L 21/683* (2006.01)
*B81C 99/00* (2010.01)
*H01L 25/065* (2006.01)
*H01L 25/00* (2006.01)

(52) U.S. Cl.
CPC ........ *H01L 21/6836* (2013.01); *B81C 99/002* (2013.01); *H01L 21/6835* (2013.01); *H01L 25/0652* (2013.01); *H01L 25/0655* (2013.01); *H01L 25/50* (2013.01); *B81C 2201/0194* (2013.01); *H01L 2221/68354* (2013.01); *H01L 2221/68363* (2013.01); *H01L 2221/68368* (2013.01); *H01L 2221/68381* (2013.01)

(58) Field of Classification Search
None
See application file for complete search history.

(56) References Cited

U.S. PATENT DOCUMENTS

| 7,622,367 | B1 | 11/2009 | Nuzzo et al. |
| 7,943,491 | B2 | 5/2011 | Nuzzo et al. |
| 8,664,699 | B2 | 3/2014 | Nuzzo et al. |
| 9,735,077 | B1* | 8/2017 | Chen ............... G06F 15/7803 |
| 2007/0032089 | A1 | 2/2007 | Nuzzo et al. |

(Continued)

FOREIGN PATENT DOCUMENTS

| DE | 112011101135 T8 | 5/2013 |
| EP | 2339614 A1 | 6/2011 |
| WO | 2011126726 A1 | 10/2011 |

*Primary Examiner* — Benjamin P Sandvik
(74) *Attorney, Agent, or Firm* — Greenberg Traurig LLP (57) ABSTRACT

The transfer of devices or device components from a carrier substrate to a further carrier substrate or to a plurality of further carrier substrates can be performed with little effort (few transfer steps) to the at least one further carrier substrate. The method comprises producing first devices on the first carrier substrate in a two-dimensional grid. It comprises defining positions on the second carrier substrate on the basis of the two-dimensional grid for at least some of the first devices. It comprises releasing a plurality of the first devices from the first carrier substrate while maintaining the two-dimensional grid. Finally, the plurality of first devices are applied to the second carrier substrate in the defined positions while maintaining the two-dimensional grid or a multiple thereof in at least one of the two directions.

9 Claims, 3 Drawing Sheets

(56) References Cited

U.S. PATENT DOCUMENTS

| | | |
|---|---|---|
| 2008/0108171 A1 | 5/2008 | Rogers et al. |
| 2009/0199960 A1 | 8/2009 | Nuzzo et al. |
| 2009/0294803 A1 | 12/2009 | Nuzzo et al. |
| 2010/0258543 A1* | 10/2010 | Mizuno ................ H01L 21/268 |
| | | 219/121.72 |
| 2013/0069275 A1 | 3/2013 | Menard et al. |
| 2013/0187540 A1* | 7/2013 | Tischler ................ H01L 33/501 |
| | | 313/512 |
| 2013/0210194 A1* | 8/2013 | Bibl ........................ H01L 24/83 |
| | | 438/107 |
| 2013/0320503 A1 | 12/2013 | Nuzzo et al. |
| 2015/0155261 A1* | 6/2015 | Uhm ........................ H01L 24/83 |
| | | 438/107 |
| 2017/0179096 A1* | 6/2017 | Dang ........................ H01L 24/32 |
| 2017/0200648 A1* | 7/2017 | Lee .................... H01L 21/76251 |
| 2020/0259057 A1* | 8/2020 | Pearson ................ H01L 23/538 |
| 2020/0295225 A1* | 9/2020 | Hsieh ................ H01L 25/0753 |

* cited by examiner

METHOD FOR A TRANSFER PRINT BETWEEN SUBSTRATES

FIELD OF THE INVENTION

This disclosure relates and relate generally to the technical field of the production of micro-technical devices, i.e. devices produced by applying micro-technical processes, which are used, for example, for the production of integrated circuits, micromechanical, micro-opto-electronic, micro-electromechanical components, in which at least some dimensions of components are within a range of some 100 μm to less than 1 μm. In particular, this disclosure relates to the field of micro-technical devices, where in devices or components thereof are produced on a carrier substrate, and are then transferred to a further carrier substrate, on which other devices may already be produced.

In the production of modern micro-technical devices, e.g. integrated circuits and the like, there are increasing efforts to combine different production processes and devices or components resulting therefrom, for example, in order to suitably merge different characteristics of the various production processes and the materials used therein. In this respect, a so-called "transfer printing" technique is applied, wherein, for example, semiconductor devices are released from a first semiconductor wafer and are transferred to a second semiconductor wafer by use of stamp and are printed thereon or applied thereto.

BACKGROUND

US 2009/0294803 A1, DE 11 2011 101 135 T5 and U.S. Pat. No. 8,664,699 B2 describe the technique of transfer printing, in which semiconductor devices can be transferred from a first semiconductor wafer to a new substrate by use of a stamp made of elastomeric material. This second substrate may, for example, also be a second semiconductor wafer. The devices to be transferred are initially masked and etched free at the sides. In this etching step, etching is performed around the device, except for small so-called breakable connection elements. In a next etching step, material is etched away from beneath the device so that the device is now substantially exposed and is mechanically retained by the connection elements only. Some devices are brought into conformal contact with the surface of a stamp so that these devices can be released from the first semiconductor wafer by adhesion to the stamp, i.e. the connection elements are broken. Then, the devices adhering to the stamp are brought into conformal contact with the new carrier substrate and fixed thereto.

Using this method, it is possible, for example, to transfer a plurality of devices produced on a first carrier substrate, e.g. gallium nitride transistors (GaN transistors), from a first semiconductor wafer to a second semiconductor wafer per stamping procedure, wherein the first and second semiconductor wafers may differ from each other in one or more properties. For example, the semiconductor wafers, which serve as corresponding carrier substrates, may differ in type of material, crystal orientation, wafer diameter and wafer thickness, wherein different process techniques are employed, where necessary, to produce the desired devices and components, respectively, on the respective carrier substrates. After transfer printing, for example, insulation layers and/or conductive layers can be deposited over the second carrier substrate, which now comprises the previously transferred devices in suitable positions, and then structured in further semiconductor-process processing steps in order to produce the mechanical and/or electrical and/or optical connections required for the desired function. The processing on the basis of the entire carrier substrate enables a cost-effective manufacture, since the processing is performed for a plurality of assembled devices, e.g. circuits, in the same processing step, as is known also for the production of standard integrated circuits. For example, GaN transistors with high electron mobility and thus high conductivity can be covered, structured and wired to a metal layer by means of an insulation layer provided with vias after transfer thereof to another suitable carrier substrate.

U.S. Pat. No. 7,932,123 B2 describes methods, in which the functional structures produced on a suitable carrier substrate are made "printable" by a plurality of so-called "release layers" so that they can be transferred to a further carrier substrate.

U.S. Pat. No. 7,943,491 B2 and US 2013/0069275 A1 describe a kinetically controlled method, in which the adhesion forces occurring between a component to be transferred and the transfer stamp are changed by the release rate or separation rate in order to temporarily attach the components to be transferred to the stamp, and to then finally fix them to the receiver. In the case of a fast separation, high adhesion forces are created so that the components temporarily adhere to the stamp and are released from the donor. On the other hand, release of the components from the stamp is achieved by a low separation rate and thus a low adhesion force.

U.S. Pat. No. 7,799,699 B2 describes the etching free of AlGaN/GA heterostructure devices on (111) silicon. By suitable masking and vertical plasma etching, exposed, i.e. unmasked trenches are etched next to the device. In the horizontal direction, the devices are etched free by etching the silicon carrier substrate beneath the device with tetramethylammonium hydroxide (TMAH). Mechanical fixing in the horizontal direction is achieved by suitable interruptions of the trenches. These interruptions can be material bridges or connection elements which are not etched away.

US 2013/0210194 A1 discloses an electrostatic transfer method and refers to the transfer printing method with elastomeric stamps. A method is described which comprises a first carrier with first devices provided thereon in a grid and a second carrier with functional devices, such as transistors, as second devices which are also provided in the form of a grid. Release from the first carrier performed by a head/stamp. A plurality of the first devices are applied to the second carrier while maintaining the grid. Further first devices, which have not yet been released from the first carrier, are available for application to the second carrier in not yet occupied positions.

EP 2 339 614 A1 shows a transfer method comprising a first carrier and first devices, such as MEMS or CMOS, produced thereon in a grid, and a second carrier, such as a PCB or a device carrier substrate, with second devices, wherein a further carrier releases the devices from the first carrier and applies them to the second carrier.

The known techniques for producing devices or components thereof on a first carrier substrate, and for transferring them to a second carrier substrate, which is used, for example, for producing other devices, allow the production of effective micro-technical devices, e.g. in the form of integrated circuits, in which various components are employed, for example control electronics based on CMOS technology in connection with power transistors produced by a another technology, so that this field of micro-technology provides a wide range of versatile and efficient devices. However, the efficiency in transferring devices from a carrier substrate to a further carrier substrate is relatively low, since only a few devices, or even only a single device, are transferred from the first carrier substrate to the desired position on the second carrier substrate per procedure.

SUMMARY OF THE INVENTION

Thus, there is a need for improving a transfer of devices or device components from a first carrier substrate to a further carrier substrate or to a plurality of carrier substrates by efficiently (space-saving) producing a greater number of devices or device components on a carrier substrate and transferring them with as little effort as possible (efficiently), for example by as few transfer steps as possible, to at least one further carrier substrate.

The disclosure is based on the realization that the geometrical properties of the devices to be transferred as well as the measures required for releasing them from the carrier substrate are to be considered when selecting the suitable positions on the further carrier substrate, to which the devices are to be transferred. The positions, in which the devices to be transferred are to be arranged on the receiving further carrier substrate, are defined such that, on the one hand, the functional requirements, e.g. the connection to existing devices or device structures on the receiving carrier substrate, are taken into account, or can be taken into account in subsequent process steps, and, on the other hand, the geometrical conditions required for the production of the devices to be transferred and for releasing them from their carrier substrate are considered so that the spatial relationships between the plurality of devices to be transferred and the positions defined on the receiving carrier substrate match each other when releasing the devices to be transferred from the carrier substrate and when applying them to the other carrier substrate.

It is thus possible to utilize and maintain the geometry predetermined by their arrangement on the carrier wafer already when releasing the plurality of devices (or device components) to be transferred in a single step, since the spatial arrangement of the defined positions on the receiving carrier substrate has also been defined using the same geometry.

In particular, according to a first embodiment, the above-mentioned object is achieved by a method for transferring devices from a first carrier substrate to a second carrier substrate. The method comprises the production of device son the first carrier substrate in a two-dimensional grid. Positions on the second carrier substrate are defined on the basis of the two-dimensional grid for at least some of the devices. A plurality of the devices are released from the first carrier substrate while maintaining the two-dimensional grid, and the plurality of devices are applied to the second carrier substrate in the defined positions while maintaining the two-dimensional grid.

Thus, it is possible to suitably position a plurality of devices of the first carrier substrate, which is, for example, a semiconductor wafer, per transfer, since the defined positions on the second carrier substrate, which may, for example, also be a semiconductor wafer, represent positions of the two-dimensional grid. Thus, a plurality of devices can be transferred simultaneously to a plurality of defined positions per transfer, wherein precisely those devices in the two-dimensional grid are selected during release which correspond to the positions on the second carrier substrate.

In the method according to the invention, the defined positions on the second carrier substrate correspond to an integer multiple of the pitches of the two-dimensional grid in the respective linearly independent directions, wherein N is a (positive) integer.

The positions on the second carrier substrate, and thus also the arrangement of the devices to be transferred in devices or device components possibly already produced on the second carrier substrate, are located on grid points predetermined by the two-dimensional grid so that the distances between the respective defined positions and thus the devices to be transferred to the second carrier substrate are defined as corresponding integer multiples of the pitches of the two-dimensional grid, and thus a plurality of devices can be arranged in the correct positions without additional measures, except for the adjustment during transfer, for example adjustment of a stamp, which is required in any case. Thus, those grid points on the first carrier substrate are selected for each transfer step, which correspond to the defined positions on the second carrier substrate and fit into an area, for example the area of a transfer stamp, available for contacting, releasing and applying.

The selection of the defined positions on the receiving carrier substrate is thus performed in consideration of the geometrical aspects with respect to the sizes of the devices to be transferred and the space around the devices required for release thereof so that the devices to be transferred are arranged on the second carrier substrate such that an efficient utilization of the area of the carrier substrate can be achieved. At the same time, this grid created in the production of the devices to be transferred forms the basis for the selection of the defined positions on the second carrier substrate. For example, devices can already be produced on the second (receiving) carrier substrate, wherein the production thereof is performed in consideration of the two-dimensional grid such that at least all positions in which the devices to be transferred are to be arranged are defined on the basis of the two-dimensional grid. Of course, corresponding design criteria are also to be considered such that a desired connection in an electrical and/or mechanical and/or optical respect is achieved, or can be achieved in subsequent process steps.

Especially in the variant, in which pitches of the two-dimensional grid correspond to the sum of the sizes of a device and the intermediate space required for release thereof in the respective linearly independent direction, for example in two directions perpendicular to each other, as is common in the production of semiconductor devices, an optimum utilization of the area of the first carrier substrate is accomplished, since only the minimum area required for producing and releasing the devices defines the pitch, i.e. the distance between two adjacent grid points, and thus a maximum number of the devices to be transferred can be produced on the first carrier substrate.

In another variant, further devices in the two-dimensional grid on the first carrier substrate, which have not yet been released therefrom, are released and applied to the second carrier substrate while maintaining the two-dimensional grid in not yet occupied, defined positions. Thus, the step of transferring can be repeated with a plurality of devices which can also be released from the first carrier substrate and simultaneously arranged correctly on the second carrier substrate on the basis of the two-dimensional grid.

In a further variant, second devices on the second carrier substrate are produced in consideration of the two-dimensional grid such that the defined positions have a spatial relationship to the second devices required for the function thereof.

As indicated above, also devices which require one or more of the first devices for the correct function thereof can be produced on the second carrier substrate, wherein the arrangement and/or the entire design of the second devices is performed such that at least the defined positions are selected in consideration of the two-dimensional grid.

For example, when a great number of second devices are produced on a semiconductor wafer, e.g. preferably as CMOS-integrated circuits, and a respective first device is provided in each second device for obtaining the desired function, the production of the second devices is performed such that the positions are selected in consideration of the two-dimensional grid across the devices. Thus, the first devices for a plurality of second devices can be transferred and arranged depending on the areal extension of the device used for transfer, for example an elastomeric stamp. The same applies to a situation in which two or more first devices are to be accommodated in at least some of the second devices, wherein the respective defined positions are then selected corresponding to the two-dimensional grid also within an individual second device so that not only first devices for various second devices, but also a plurality of first devices to be arranged within individual second devices can be transferred at the same time. In an advantageous variant, the second devices are produced by applying CMOS process techniques. Thus, it is possible to use well known and approved process techniques of CMOS technology for the second devices, while the first devices, which thus have properties that cannot, or only with increased efforts, be obtained by standard CMOS techniques, can be simultaneously integrated in an optimized manner. Also the reverse case is possible, when such CMOS devices are produced on the first carrier substrate via CMOS process techniques as first devices which are transferred to the second carrier substrate.

In a further variant, positions on a further carrier substrate are defined on the basis of the two-dimensional grid for at least some of the devices, and a plurality of devices of the first carrier substrate are applied to the further carrier substrate in said positions while maintaining the two-dimensional grid.

In one variant, an arrangement of the positions on the second carrier substrate differs from an arrangement of the positions on the further carrier substrate. The first carrier substrate, or even a plurality of first carrier substrates having the same configuration can be used for efficiently transferring the first devices to carrier substrates of a generally different design.

For example, devices, e.g. integrated circuits or the like, in which, for example, the number of the required first devices and/or the positions thereof vary, can be produced on the second carrier substrate and the further carrier substrate, wherein, however, no changes to the production process for the devices to be transferred on the first carrier substrate are required. Since also the positions selected on the further carrier substrate are selected in consideration of the two-dimensional grid, it is merely required during transfer to select the corresponding grid positions for release on the first carrier substrate and to transfer the released first devices to the further carrier substrate, on which they are automatically positioned correctly.

The release of a plurality of the first devices from the first carrier substrate and a transfer for applying the plurality of devices to the second carrier substrate can be performed by use of a stamp, the lower stamp surface of which is adjusted to the two-dimensional grid. It is capable of lifting the devices from the first carrier substrate by applying adhesion forces.

According to a further embodiment, the mentioned object is achieved by a carrier substrate with micro-technical devices. The carrier substrate comprises externally produced devices produced on an external carrier substrate and transferred to defined positions on the claimed carrier substrate. The carrier substrate further comprises devices produced internally on the carrier substrate which have a spatial relationship to the externally produced devices required for the function thereof, wherein the defined positions are arranged in a two-dimensional grid, the pitches of which in two linear, independent directions are determined on the basis of the sizes of an externally produced device and an intermediate space required for release thereof.

The claimed carrier substrate thus comprises a plurality of micro-technical devices, wherein at least some of them are a combination of internally produced devices and one or more externally produced devices, wherein, due to the above-described transfer technique, the externally produced devices are arranged on the claimed carrier substrate according to a two-dimensional grid, the pitches of which are determined precisely by the geometrical and production-related properties of the externally produced devices, as already described above. In one variant, especially a distance between two externally produced devices on the carrier substrate in a respective linearly independent direction corresponds to an integer multiple, with N as an integer of the corresponding pitch, wherein especially N is greater than 1.

According to a third embodiment, the above-mentioned object is achieved by a micro-technical device. The micro-technical device includes a carrier substrate with device components internally produced therein and thereon which form e.g. an integrated circuit. Further, the micro-technical device, which may, for example, be an integrated circuit chip, comprises externally produced devices produced on an external carrier substrate and transferred to defined positions on the carrier substrate. The internally produced device components have a spatial relationship to the externally produced devices required for the function of the micro-technical device, wherein the defined positions comply with a two-dimensional grid, the pitches of which in two linear and independent directions are determined on the basis of the sizes of one of the externally produced devices and the intermediate space required for release thereof.

The claimed micro-technical device, e.g. in the form of an integrated circuit chip, comprises a plurality of externally produced devices which have been transferred from another carrier substrate using the above-described techniques and which now occupy positions in the micro-technical device corresponding to a grid, as described above.

Also in this case it holds true that, in one variant, a distance between two externally produced devices in a respective linearly independent direction corresponds to an integer multiple, with N as an integer, wherein especially N is greater than 1.

According to a further embodiment, a method for transferring devices from a first carrier substrate to a second carrier substrates is suggested. The method for transferring devices from a first carrier substrate to a second carrier substrate comprising: producing first devices on a first carrier substrate in a two-dimensional grid. Further, defining positions on the second carrier substrate on the basis of the two-dimensional grid and positions of second devices produced (i.e. at least present) on the second carrier substrate for at least some of the first devices. Releasing a plurality of the first devices from the first carrier substrate while maintaining the two-dimensional grid. Applying the plurality of devices to the second carrier substrate in the defined positions while maintaining the two-dimensional grid.

Pitches of the two-dimensional grid in two directions linearly independent of each other each correspond to the sum of the sizes of a first device and the intermediate space required for release thereof in the respective linearly independent direction.

The defined positions on the second carrier substrate correspond to integer multiples, with integer N=1, 2, 3, . . . , n.

of the pitches of the two-dimensional grid in at least one or both of the linearly independent directions. N may start with 2 in a respective remaining direction, or N=2 in both directions.

SUMMARY OF EMBODIMENTS

Embodiments of the invention are illustrated by examples and not in a way that transfers or incorporates limitations from the Figures into the patent claims. Same reference numerals in the Figures indicate same or highly similar elements.

DETAILED DESCRIPTION OF EMBODIMENTS

All examples of the invention allow that devices, e.g. CMOS circuits, are or have been produced on a receiving carrier substrate, e.g. a semiconductor wafer. Per circuit, one or more devices of a donor carrier substrate, e.g. a semiconductor wafer, can be positioned by transfer printing. The devices on the donor semiconductor wafer are used in a highly efficient manner, i.e. as completely as possible (in the sense of preferably all devices per carrier wafer).

Per stamping procedure, as many devices as possible are transferred simultaneously and disposed simultaneously in a plurality of positions of the receiving carrier substrate in devices or circuits possibly present thereon.

In an advantageous embodiment, the positions for the devices to be transferred on the receiving carrier substrate, e.g. the semiconductor wafer, are arranged exclusively in a grid, the pitches of which are defined in a first direction, e.g. the horizontal direction in the subsequently described Figures, and in a second direction linearly independent of the first direction, e.g. the vertical direction in the following illustration, by the sizes of the devices to be transferred and the intermediate space required for etching them free on the donor carrier substrate, e.g. a semiconductor wafer. The width of the intermediate space or scribing trench is predetermined by the technical requirements for etching free, e.g. the width required for etching a trench to the required depth, and for positioning the connection elements. This grid is used on the receiving carrier substrate for both, devices to be transferred in adjacent circuits and a plurality of devices to be transferred per circuit.

In one embodiment, a distance between two positions and thus two devices to be transferred on the receiving carrier substrate in the first linearly independent direction, e.g. the horizontal direction, is defined as an integer multiple, with N=1, 2, 3, . . . , n, of the pitch in this direction. In an advantageous variant, the underlying pitch is the sum of the "horizontal" device dimension plus the horizontal intermediate space dimension. The distance between the second positions in the other linearly independent direction, i.e. the "vertical" direction, is defined as an integer multiple of the sum of the "vertical" device dimension plus the "vertical" intermediate space dimension.

In one embodiment, the arrangement of the devices on the first carrier substrate is a grid preferably occupied in all positions and having the above-defined pitch.

The arrangement of the devices applied by transfer printing on the receiving carrier substrate is a uniform grid across the entire wafer, wherein, however, only every $m^{th}$ position in the "horizontal" direction and every $n^{th}$ position in the "vertical" direction are occupied, wherein m, n=1, 2, 3, . . . applies.

Figure 3:
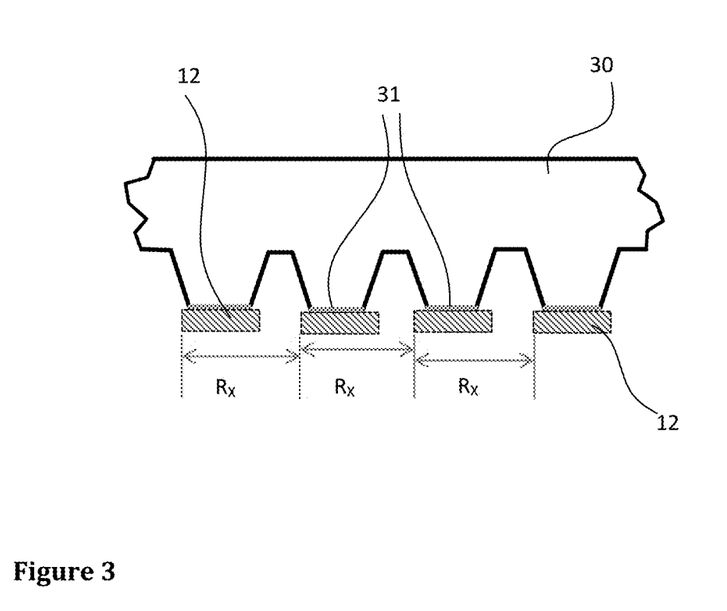
FIG. 3 shows a schematic vertical cross-section through a stamp 30 having an elastomeric lower surface 31 or such lower surface parts.

The arrangement of the devices to be transferred on a transfer device, e.g. a stamp 30 according to FIG. 3, is thus a uniform grid, wherein, corresponding to the defined positions, consequently only every $m^{th}$ position in the "horizontal" direction and every $n^{th}$ position in the "vertical" direction are occupied, wherein m, n=1, 2, 3, . . . applies. That is, in transfer printing, every $m^{th}$ device in the "horizontal" direction and every $n^{th}$ device in the "vertical" direction are transferred simultaneously. In the next printing procedure, this grid is shifted, for example, by one pitch and the next devices are transferred.

A plurality of devices are transferred simultaneously per transfer procedure.

The receiving (second) carrier substrate is completely printed in a few transfer printing procedures depending on the size of the stamp surface 31 available for the transfer. A maximum of devices can be removed from the (first) carrier substrate, as the donor carrier substrate, and be transferred. In particular, when the first carrier substrate has the same design, various arrangements can be printed on the second carrier substrate, i.e. carrier substrates with various devices, such as CMOS circuits, and with various device arrangements.

Figure 1:
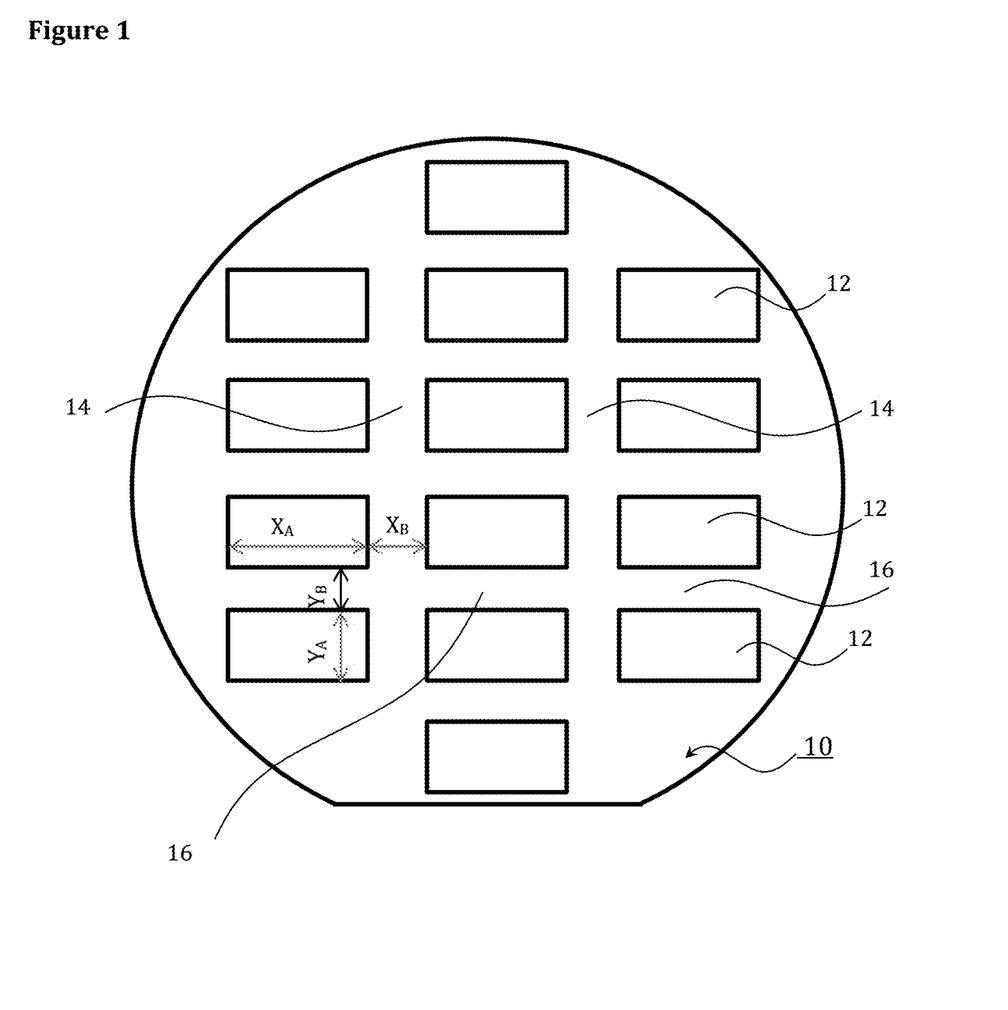
FIG. 1 is a schematic view of a first carrier substrate with devices and intermediate spaces forming a two-dimensional grid which serves as a basis for the positioning of these devices on a second carrier substrate.

FIG. 1 shows a first carrier substrate 10, e.g. in the form of a first semiconductor wafer, with devices 12 to be transferred. The devices 12 have a dimension $X_A$ in a first linear direction, which is referred to as the horizontal direction in the following, and a dimension $Y_A$ in a second linear direction, which is referred to as the vertical direction in the following. Vertically extending intermediate spaces 14 having a width $X_B$ and horizontally extending intermediate spaces 16 having a width $Y_B$ are defined by the requirements of etching free and positioning of the connection elements.

Figure 2:
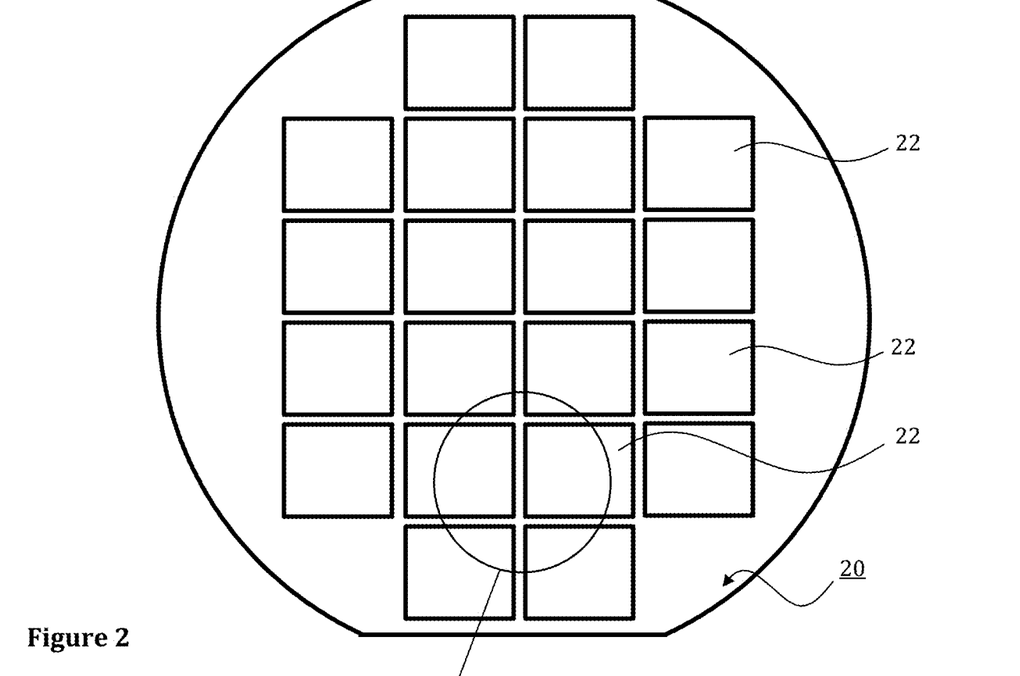
FIG. 2 shows a second carrier substrate with second devices, for example in the form of circuits, and devices transferred from the first carrier substrate, wherein the enlarged section of FIG. 2a shows the positions and the transferred devices defined on the basis of the two-dimensional grid which is determined by the first devices on the first carrier substrate.

FIG. 2 shows a second carrier substrate 20, e.g. in the form of a second semiconductor wafer, with second devices 22 arranged thereon, e.g. CMOS circuits. The CMOS circuits 22 each contain at least one device 24 positioned therein by transfer printing. The combination of device 22 and device 24 forms a micro-technical device so that the second carrier substrate comprises a plurality of micro-technical devices. After completion of the processing of the micro-technical devices, i.e. the combination of devices 22 and devices 24, they can be separated on the basis of known techniques so that e.g. corresponding circuit chips are obtained which comprise at least one transferred device and, in a further embodiment, a plurality of transferred devices 24, the positions of which are determined by the transfer strategy described above and below.

Figure 2A:
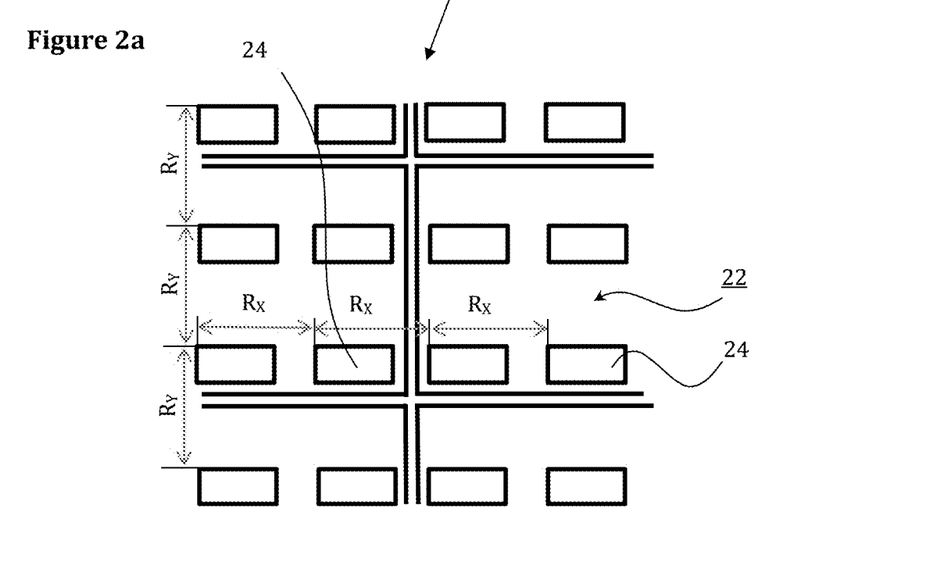
FIG. 2a shows the enlarged section of FIG. 2.

The devices 24 basically correspond to the devices 12 after transfer thereof from the first carrier substrate 10 to the second carrier substrate 20 according to FIG. 2a, wherein edge areas of the devices 12 to be transferred may be modified due to the release procedure so that different reference numerals are used for the devices prior to release thereof and for the devices after transfer.

FIG. 2a describes an embodiment, in which the pitch $R_X$ in the horizontal direction is equal to the sum of the device dimensions $X_A$ and the width of the intermediate space $X_B$ ...

$$R_X = N^*(X_A + X_B) \text{ when } N=1$$

The pitch $R_Y$ in the vertical direction is an integer multiple of the sum of the device dimensions $Y_A$ and the width of the intermediate space $Y_B$ ...

$$R_X = N^*(Y_A + Y_B) \text{ when } N=2$$

The devices 12 to be transferred in the topmost row of three of FIG. 1 are thus transferred to the topmost row of the devices 24 in FIG. 2a. The devices 12 to be transferred in the third row of three from the top in FIG. 1 are thus transferred to the second row from the top of the devices 24 in FIG. 2a.

FIG. 3 shows the configuration for N=1 in the horizontal direction corresponding to FIG. 2a and a schematic vertical cross-section through a stamp 30 having an elastomeric lower surface 31 or such lower surface parts. Also, a substantial portion or the entire stamp can be made of a resilient, especially elastomeric material, i.e. more than at least the lower surface. It moves from the donor wafer to the receiving wafer and carries the devices 12 which it places onto the receiving wafer 20 after lowering thereof.

During use thereof, it picks up devices 12—which adhere thereto due to adhesion forces—from the first wafer, lifts them off and transfers them. Adhesion of the devices 12 to be transferred and to be placed by printing (via "transfer printing") to the lower stamp surface 31 (the bottom stamp area) is accomplished by means of a grid $R_X$ in the horizontal direction and by means of grid $R_Y$ in the vertical direction (not visible).

The pitch $R_X$ in the horizontal direction is an integer multiple of the sum of the device dimensions $X_A$ and the width of the intermediate space $X_B$, wherein N is a positive integer (N=1, 2, 3, ..., n).

$$R_X = N^*(X_A + X_B)\ N = 1, 2, 3 \ldots$$

The pitch $R_Y$ in the vertical direction (not shown) is an integer multiple of the sum of the device dimensions $Y_A$ and the width of the intermediate space $Y_B$, wherein N is a positive integer (N=1, 2, 3, ..., n).

$$R_Y = N^*(Y_A + Y_B)\ N = 1, 2, 3 \ldots$$

The selection of the positions and thus the arrangement of the devices 24 placed by transfer printing (the respective distance between two devices 24 on the second carrier substrate 20) is performed using a dimension $R_X$ in the horizontal direction and using a dimension $R_Y$ in the vertical direction. In this embodiment, the dimension $R_X$ in the horizontal direction is an integer multiple of the sum of the device dimensions $X_A$ and the width of the intermediate space $X_B$, wherein this sum forms the basic pitch of the two-dimensional grid in the first linearly independent direction, by means of which the devices 12 are arranged on the first carrier substrate 10.

The dimension or position $R_X$ is thus an integer multiple of the basic pitch $(X_A + X_B)$ ...

$$R_X = N^*(X_A + X_B)\ N = 1, 2, 3 \ldots$$

The dimension or position $R_Y$ in the vertical direction is an N-fold of the sum of the device dimensions $Y_A$ and the width of the intermediate space $Y_B$ in the second linearly independent direction. The dimension or position $R_Y$ is thus an integer multiple of the basic pitch $(Y_A + Y_B)$.

$$R_Y = N^*(Y_A + Y_B)\ N = 1, 2, 3 \ldots$$

The definition of positions for the devices 24 by means of the dimensions $R_X$ and $R_Y$ applies from device 24 to adjacent device 24, wherein the relevant devices may be located within a CMOS circuit 22, but also in adjacent circuits.

In further examples, $R_X$ or $R_Y$ may also start with N=2, while the respective other grid still starts with N=1. Likewise, both grids may start with N=2, i.e. a positive integer "multiple" of the respective basic pitch.

Due to the efficient transfer of the devices 12 (or 24) to second carrier substrates 20, which may have configurations differing from each other, but on which the positions of the transferred devices 24 are each defined by the dimensions $R_X$ and $R_Y$, which are based on the same basic pitches, e.g. $X_A + X_B$ and $Y_A + Y_B$, for all second carrier substrates, efficiently combined micro-technical devices can be produced with little effort, as compared to conventional transfer techniques. GaN devices, e.g. high-voltage HEMTs, can be integrated into CMOS structures. Thus, first devices can be transferred from the first carrier substrate to the second carrier substrate (via transfer printing).

Due to the examples of the invention, a transfer printing process can be made considerably more efficient and less expensive. In addition, in contrast to a monolithic integration, also processes producing critical dimensions of less than 0.6 µm can be used with integrated GaN devices.

Conversely, also CMOS devices 12 can be lifted off, transferred and printed on the second carrier substrate. Also in this case, first devices are transferred from the first carrier substrate to the second carrier substrate (via transfer printing).

Particularly preferably, GaN devices are transferred and printed on or in CMOS circuits via micro-transfer printing. Likewise, CMOS circuits or elements thereof can be printed on or between GaN devices.

The invention claimed is:
1. A method for transferring devices from a first carrier substrate (10) to a second carrier substrate (20), comprising:
   producing first devices (12) on the first carrier substrate in a two-dimensional grid;
   pre-defining positions on the second carrier substrate on the basis of the two-dimensional grid on the first carrier substrate and positions of second devices (22) produced and present on the second carrier substrate for at least some of the first devices (12);
   wherein the second devices (22) on the second carrier substrate are produced based on the two-dimensional grid such that the defined positions have a spatial relationship to the second devices required for a technical function thereof;
   wherein the second devices (22) are produced by applying CMOS process techniques;

wherein the two-dimensional grid is determined on the basis of a width and length of one of the first devices and an intermediate space required for release thereof;

releasing a plurality of the first devices (12) from the first carrier substrate while maintaining the two-dimensional grid and transferring the released first devices to the second carrier substrate;

applying the plurality of transferred first devices to the second carrier substrate in the defined positions while maintaining the two-dimensional grid;

wherein further first devices in the two-dimensional grid on the first carrier substrate, not yet released therefrom, are released, transferred and applied to the second carrier substrate while maintaining the same two-dimensional grid in not yet occupied but defined positions;

and wherein two or more first devices are accommodated in at least some of the second devices and in the two-dimensional grid;

and the release of a plurality of the first devices from the first carrier substrate and a transfer for applying the released plurality of first devices to the second carrier substrate is performed by use of a transfer stamp, a lower stamp surface thereof being adjusted to the two-dimensional grid.

2. The method according to claim 1, wherein pitches of the two-dimensional grid in two directions linearly independent of each other each corresponds to a sum of the width and length of one of the first devices, respectively, and a respective intermediate space between neighbored first devices, required for release thereof.

3. The method according to claim 2, wherein the predefined positions on the second carrier substrate correspond to integer multiples of the pitches of the two-dimensional grid in both directions.

4. The method according to claim 1, wherein positions on a further carrier substrate are defined on the basis of the two-dimensional grid for at least some of the first devices, and a plurality of first devices of the first carrier substrate are applied to the further carrier substrate in the defined positions while maintaining the two-dimensional grid.

5. The method according to claim 1, wherein the first devices on the first carrier substrate are produced based on the two-dimensional grid such that the defined positions have a spatial relationship to the second devices required for a technical function thereof in a combination with one or more first devices.

6. The method according to claim 5, wherein the first devices (12) are produced by applying CMOS process techniques, and are CMOS devices.

7. The method according to claim 4, wherein further devices on the further carrier substrate are produced based on the two-dimensional grid such that the defined positions have a spatial relationship to the further devices required for the technical function thereof, and wherein the further devices are produced by applying CMOS process techniques.

8. The method according to claim 4, wherein an arrangement of the positions on the second carrier substrate differs from an arrangement of the positions on the further carrier substrate.

9. The method according to claim 5,
wherein positions on a further carrier substrate are defined on the basis of the two-dimensional grid for at least some of the first devices, and a plurality of first devices of the first carrier substrate are applied to the further carrier substrate in the defined positions while maintaining the two-dimensional grid; and
wherein an arrangement of the positions on the second carrier substrate differs from an arrangement of the positions on the further carrier substrate.

* * * * *